United States Patent
Macours

(10) Patent No.: US 8,812,923 B2
(45) Date of Patent: Aug. 19, 2014

(54) ERROR CONCEALMENT FOR SUB-BAND CODED AUDIO SIGNALS

(75) Inventor: Christophe Marc Macours, Hodeige (BE)

(73) Assignee: NXP, B.V., Eindhoven (NL)

( * ) Notice: Subject to any disclaimer, the term of this patent is extended or adjusted under 35 U.S.C. 154(b) by 212 days.

(21) Appl. No.: 13/302,094

(22) Filed: Nov. 22, 2011

(65) Prior Publication Data

US 2012/0137189 A1    May 31, 2012

(30) Foreign Application Priority Data

Nov. 29, 2010 (EP) .................................... 10192870

(51) Int. Cl.
| | | |
|---|---|---|
| *H04L 1/18* | (2006.01) | |
| *G10L 15/00* | (2013.01) | |
| *G10L 19/005* | (2013.01) | |
| *H03M 7/30* | (2006.01) | |
| *G10L 19/02* | (2013.01) | |
| *H04L 1/00* | (2006.01) | |

(52) U.S. Cl.
CPC ............ *G10L 19/005* (2013.01); *H03M 7/3046* (2013.01); *G10L 19/0204* (2013.01); *H04L 1/0072* (2013.01)
USPC .......................................... 714/746; 704/236

(58) Field of Classification Search
CPC ............. G10L 19/005; G10L 19/0204; H03M 7/3046; H04L 1/0072; H03H 20/0043
USPC .................................. 714/746, 776
See application file for complete search history.

(56) References Cited

U.S. PATENT DOCUMENTS

| | | | |
|---|---|---|---|
| 6,490,551 B2 | 12/2002 | Wiese et al. | |
| 7,003,448 B1 | 2/2006 | Lauber et al. | |
| 7,110,941 B2 * | 9/2006 | Li ............................... | 704/200.1 |
| 7,321,559 B2 * | 1/2008 | Etter et al. ..................... | 370/242 |
| 7,324,024 B2 * | 1/2008 | Fujiyama et al. ............... | 341/61 |

(Continued)

FOREIGN PATENT DOCUMENTS

| | | |
|---|---|---|
| CN | 101399040 A | 4/2009 |
| CN | 101542594 A | 9/2009 |
| EP | 0 718 982 A2 | 6/1996 |
| EP | 1 199 709 A1 | 4/2002 |

OTHER PUBLICATIONS

Tsekeridou, S.; Pitas, I., "MPEG-2 error concealment based on block-matching principles," Circuits and Systems for Video Technology, IEEE Transactions on , vol. 10, No. 4, pp. 646,658, Jun. 2000.*

(Continued)

*Primary Examiner* — Cynthia Britt

(57) ABSTRACT

A decoder and method of decoding a sub-band coded digital audio signal. The decoder comprises: an input, for receiving sub-band coefficients for a plurality of sub-bands of the audio signal; an error detection unit, adapted to analyze the content of a sequence of coefficients in one of the sub-bands, to derive for each coefficient an indication of whether the coefficient has been corrupted by an error of a predefined type; an error masking unit, adapted to generate from the sequence a modified sequence of coefficients for the sub-band, wherein errors of the predefined type are attenuated; a coefficient combination unit, adapted to combine the received coefficients and the modified coefficients, in dependence upon the indication of error; and a signal reconstruction unit, adapted to reconstruct the audio signal using the combined coefficients.

12 Claims, 3 Drawing Sheets

(56) References Cited

U.S. PATENT DOCUMENTS

| | | | |
|---|---|---|---|
| 7,552,048 B2 | 6/2009 | Xu et al. | |
| 8,515,767 B2* | 8/2013 | Reznik | 704/500 |
| 8,548,804 B2* | 10/2013 | Barrett et al. | 704/236 |
| 2002/0019960 A1 | 2/2002 | Tanaka et al. | |
| 2008/0046248 A1* | 2/2008 | Chen et al. | 704/262 |
| 2010/0205507 A1* | 8/2010 | Song et al. | 714/758 |

OTHER PUBLICATIONS

Chen, B.; Sundberg, C-E W., "An integrated error correction and detection system for digital audio broadcasting," Broadcasting, IEEE Transactions on, vol. 46, No. 1, pp. 68,78, Mar. 2000.*

Laneman, J.N.; Sundberg, C-E W.; Faller, C., "Huffman code based error screening and channel code optimization for error concealment in perceptual audio coding (PAC) algorithms," Broadcasting, IEEE Transactions on, vol. 48, No. 3, pp. 193,206, Sep. 2002.*

Wiese, D. "Optimization of Error Detection and Concealment for ISO/MPEG/AUDIO CODECs Layer-I and II", presented at the 93$^{rd}$ AES Convention, San Francisco, 30 pgs. (Oct. 1992).

Makivirta, A. et al. "Error Performance and Error Concealment Strategies for MPEG Audio Coding", Proc Seventh Australian Teletraffic Research Seminar, vol. 2, 5, pp. 505-510 (Dec. 5, 1994).

Schroeder, E.F. et al., "Digital Audio Broadcasting (DAB)*", Collected AES Papers on Digital Audio Bit-Rate Reduction, pp. 164-170 (May 1996).

Kubota, S. et al. "Improved ADPCM Voice Signal Transmission Employing Click-Noise Detection Scheme for TDMA-TDD Personal Communication Systems", IEEE Transactions on Vehicular Technology, vol. 46, No. 1, pp. 108-113 (Feb. 1997).

Welty, J. "Click and Pop Detection" 1 pg. retrieved from the Internet at: Nov. 21, 2011 http://gwc.sourceforge.net/gwc_science/node6.html, (Sep. 11, 2001).

"Radio Broadcasting Systems; Digital Audio Broadcasting (DAB) to Mobile, Portable and Fixed Receivers" (Final Draft), ETSI EN 300 401, European Standard Telecommunications Series, No. V1.4.1, pp. 1-197, (Jan. 2006).

Extended Search Report for European Patent Appln. No. 10192870.3 (May 17, 2011).

\* cited by examiner

ERROR CONCEALMENT FOR SUB-BAND CODED AUDIO SIGNALS

CROSS-REFERENCE TO RELATED APPLICATIONS

This application claims the priority under 35 U.S.C. §119 of European patent application no. 10192870.3, filed on Nov. 29, 2010, the contents of which are incorporated by reference herein.

This invention relates to a method and apparatus for concealing errors in a received digital audio signal, which has been encoded using a Sub-Band Coding (SBC) scheme. It is particularly relevant to a DAB receiver implementing a source decoder according to the MPEG-1 Audio Layer II (MP2) standard, as defined in ISO/IEC 11172-3.

Digital Audio Broadcasting (DAB) receivers are subject to poor transmissions conditions, especially in mobile and automotive environments. Even though the channel decoder includes several error correction schemes, residual bit errors cannot be completely avoided.

Frame-level concealment techniques, to mask the effects of such bit errors, are known in the art. A simple example is to mute the output for the duration of an audio frame in which an error is detected. Another possibility is repetition, wherein an adjacent frame is used in the place of the frame containing the bit errors. If the stream comprises stereo channels, left-right substitution can be used when bit errors corrupt one channel but not the other.

A disadvantage of the known repetition and substitution techniques is that the receiver needs (additional) data memory, in order to store decoded frames (neighbouring in time, or from another stereo channel), ready to make the replacement, if necessary.

According to an aspect of the invention, there is provided a decoder for a sub-band coded digital audio signal, the decoder comprising:

an input, for receiving sub-band coefficients for a plurality of sub-bands of the audio signal;

an error detection unit, adapted to analyze the content of a sequence of coefficients in one of the sub-bands, to derive for each coefficient an indication of whether the coefficient has been corrupted by an error of a predefined type;

an error masking unit, adapted to generate from the sequence a modified sequence of coefficients for the sub-band, wherein errors of the predefined type are attenuated;

a coefficient combination unit, adapted to combine the received coefficients and the modified coefficients, in dependence upon the indication of error; and a signal reconstruction unit, adapted to reconstruct the audio signal using the combined coefficients.

The present inventors have recognized that known techniques of muting, repetition and left-right substitution all involve discarding additional data in the frame which contains the errors. Even if an audio frame contains just one bit-error the whole frame may be discarded, resulting in a waste of valid, useful information. This is in addition to the disadvantage of needing memory to store the frames which will be repeated or substituted in order to mask the error.

According to the present invention, the individual sub-band coefficients can be analysed locally. This means that if bit errors occur in just a few of the coefficients, the concealment of these errors need not result in the correctly received coefficients being discarded or substituted. Thus, the unnecessary waste of valid data can be reduced.

The present invention proposes a computationally-economical but more efficient method to reduce the subjective audio quality impairment caused by bit errors in a sub-band data of a DAB audio stream, and in particular the first sub-band. In one embodiment, it comprises detecting the time positions and optionally density of the bit errors and time-domain filtering the sub-band samples so as to remove the most perceptually annoying frequency components caused by the bit-errors.

The error masking unit generates a modified sequence of sub-band coefficients in which errors of the predefined type have been suppressed (to some extent). When the error detection unit detects an error, the coefficient combination unit combines the coefficients by relying preferentially on the modified coefficients. When no error is detected, the combination unit relies preferentially on the original coefficients. This enables a compromise between using as much of the validly received coefficient-data as possible, and mitigating the effects of incorrectly-received coefficient-data.

In a simple embodiment the combination unit may comprise a switch, operable to select the original coefficients when no error is detected and operable to select the modified coefficients when an error is detected.

The coefficient combination unit may comprise a cross-fader, adapted to mix the received coefficients and the modified coefficients in a weighted combination, wherein the weighting depends on the indication of error.

Cross-fading the received coefficients and modified coefficients in a weighted summation may avoid the introduction of discontinuities in the sequence of coefficients at the time a bit-error is detected. The cross-fader may be implemented using variable gain elements and a summation.

The error detection unit preferably comprises a high-pass filter, arranged to high-pass filter the sequence of coefficients, the output of the high-pass filter preferably being coupled to the input of an absolute value calculation unit, for calculating absolute values of the filtered coefficients, the output of the absolute value calculation unit preferably being coupled to the input of a decision unit, for deciding if an error is indicated by comparing the absolute values with a threshold.

Often, bit-errors in the sub-band coefficients (particularly the lowest sub-band) cause an audible "click" or "pop" sound in the decoded audio signal. Such artefacts can be avoided by detecting discontinuities in the sequence of coefficients and applying error concealment. The absolute value or magnitude of a high-pass filtered version of the sequence of coefficients is one simple but effective indicator of a discontinuity which may give rise to a "click" artefact. This value can be compared with a threshold, to produce a binary-valued indicator of whether a bit-error has occurred.

The high-pass filter cut-off frequency is preferably at least half of the bandwidth of the time domain signal represented by the received sub-band coefficients. For example, in the case of the SBC coding scheme used in DAB, the sub-band samples are critically down-sampled by a factor of 32, which means that the high-pass filter cut-off frequency should be greater than $0.5*((fs/2)/32)$Hz, i.e. 375 Hz at 48 kHz.

The error masking unit may comprise a low-pass or band-pass filter, for smoothing discontinuities in the sequence of coefficients.

A low-pass or band-pass filter is a simple but effective way of attenuating discontinuities that may cause a "click" artefact. The filter attenuates high-frequency components of the sequence, thereby smoothing the discontinuity. The low-pass corner frequency is typically greater or equal to half of the bandwidth of the time domain signal represented by the received sub-band coefficients, that is $0.5*((fs/2)/32)$Hz in the case of the SBC coding scheme used in DAB. The high-pass filter helps suppressing low frequency rumble generated by the corrupted samples and its corner frequency is typically lower than the half of the bandwidth of the time domain signal represented by the received sub-band coefficients, that is 0.5*((fs/2)/32)Hz in the case of the SBC coding scheme used in DAB.

The decoder may further comprise a channel decoder, adapted to receive a channel-coded bitstream; perform channel decoding; and output the sub-band coefficients.

The channel decoder may comprise, for example, a Viterbi decoder, or other decoder performing error detection or correction functions.

The decoder is preferably operable to receive a DAB audio stream encoded according to MPEG Layer 2 audio.

The invention is particularly relevant to DAB signals, especially in the case that the receiver is for a portable device or for a car. This is because such receivers may be more prone to bit-errors than a static receiver.

According to another aspect, there is provided a method of concealing a bit-error in a sub-band coded digital audio signal, the method comprising:

receiving sub-band coefficients for a plurality of sub-bands of the audio signal;

analyzing the content of a sequence of coefficients in one of the sub-bands, to derive for each coefficient an indication of whether the coefficient has been corrupted by an error of a predefined type;

generating from the sequence a modified sequence of coefficients for the sub-band, wherein errors of the predefined type are attenuated; and reconstructing the audio signal using the received coefficients and the modified coefficients, in dependence upon the indication of error.

The method can be applied to a single sub-band, preferably the first, lowest-frequency sub-band. However, it may equally be applied in other sub-bands—for example higher-frequency sub-bands.

The analysis of the content can comprise detecting a sequence of coefficients that would cause a click or other discontinuity in the reconstructed audio signal.

The detection of the click or other discontinuity preferably comprises high-pass filtering the sequence of coefficients.

The indication of whether a coefficient has been corrupted by an error may be derived by comparing the magnitude of the high-pass filtered sequence of coefficients with a threshold.

The step of generating a modified sequence of coefficients for the sub-band preferably comprises low-pass or band-pass filtering the sequence.

The step of reconstructing the audio signal preferably comprises a calculating a weighted sum of the received coefficients and the modified coefficients, wherein the weights are determined based upon the indication of error.

Weights can be determined, for example, by convolving the impulse train generated by the error detection unit by a window function and saturating the convolution output to 1. The obtained signal is the weight to be applied to the modified coefficients, called $w_m$. The weight for the received coefficients can be defined as $w_r=1-w_m$. The effect of saturation means that a sequence (or burst) of closely spaced bit errors will cause the weights to remain heavily in favour of the modified sequence.

The step of reconstructing the audio signal may further comprise synthesizing an audio signal by combining the weighted, summed coefficients with the received sub-band coefficients for the remaining sub-bands.

For example, the synthesis may be performed using a polyphase synthesis filter-bank, operable to convert the sub-band coefficients back to the time-domain. The weighted, summed coefficients (which are a combination of the original and modified sequences of coefficients) may be used in the places of the original received coefficients, in the synthesis. This step corresponds to the inverting the sub-band coding transform, which is typically a time-frequency transform.

Also provided is: a computer program comprising computer program code means adapted to perform all the steps of a method as described above when said program is run on a computer; and such a computer program embodied on a computer readable medium.

The invention will now be described by way of example with reference to the accompanying drawings, in which.

MPEG Audio Layer II, the audio codec used in DAB, is a sub-band coder. The compression takes place in the time domain with a filter bank producing 32 sub-bands equidistant in frequency, having a bandwidth of 750 Hz at a sampling rate of 48 kHz. Not all of these sub-bands are equally perceptually relevant. The first sub-band covers a bandwidth from 0 Hz (DC) to 750 Hz, which corresponds to 8 critical bands of the human auditory system, while the second sub-band covers only 4 critical bands.

Isolated bit-errors in a sub-band generate time-domain discontinuities, which are typically audible as a band-limited "click" noise. Bit-error bursts tend to randomize the time domain signal of the corrupted sub-band, which is audible as a band limited white noise.

The present inventor has observed that these artefacts are the most annoying in the first sub-band, which ranges from 0 to 750 Hz. This is not only due to the relatively low frequency resolution of the MPEG Audio Layer II filter bank, but also because a significant part of the energy of a typical audio signal is concentrated in that frequency range.

The present invention proposes a simple method to reduce the subjective quality impairment caused by bit-errors in the sub-band data of a DAB audio stream, and in particular the first sub-band. It achieves this without requiring any knowledge of past or future parts of the audio signal, which means that if offers low latency.

Figure 1:
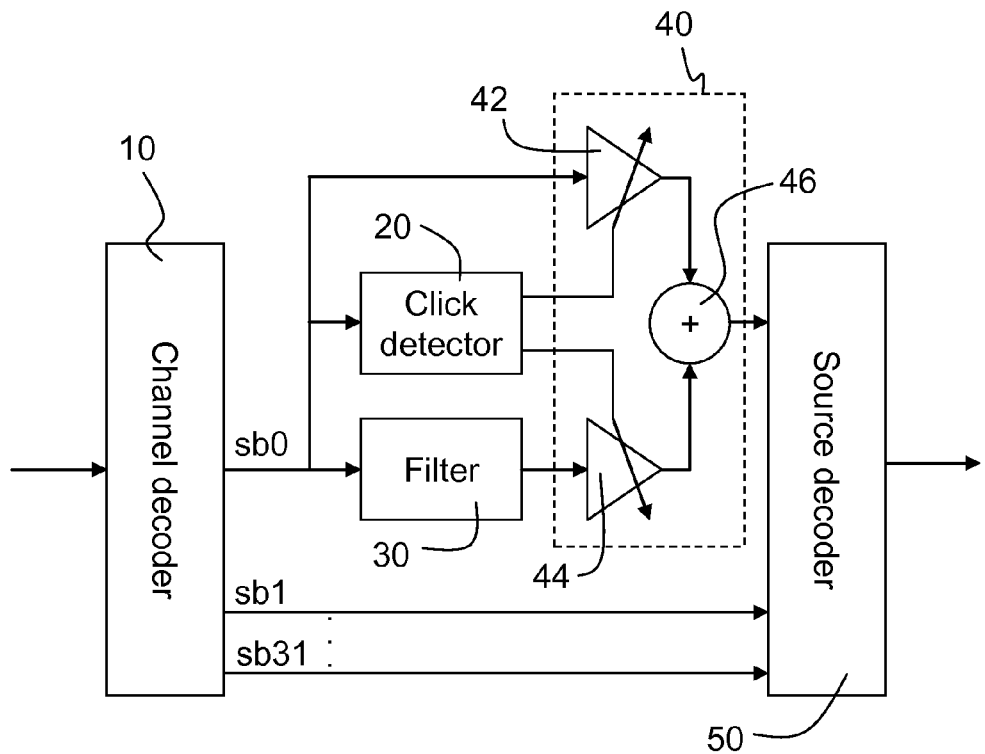
FIG. 1 is a block diagram of a receiver apparatus employing error concealment according to an embodiment.

FIG. 1 shows a block diagram of a DAB receiver apparatus according to an embodiment. Channel decoder 10 is arranged to receive a channel-coded DAB bitstream from an RF front-end (not shown). The channel decoder performs channel decoding, typically including an error correction capability. The channel decoder 10 may be the same as the conventional DAB channel decoder known in the art. The output of the channel decoder is a set of sub-band coefficients sb0-sb31 for the 32 sub-bands defined in the standard.

Source decoder 50 may be a conventional MPEG Audio Layer II source decoder. Decoder 50 comprises a poly-phase filter-bank for reconstructing the audio signal from the received sub-band coefficients, according to the MP2 standard. The output of the source decoder 50 is a Pulse Code Modulated (PCM) audio signal.

According to this embodiment, error concealment apparatus is used to process the coefficients of the first sub-band sb0, before they are input to the source decoder 50. The processing applied is non-linear. The error concealment apparatus comprises a click detector 20; and a band-pass filter 30, both of which are arranged to receive sub-band coefficients for the first sub-band sb0, from the channel decoder 10.

The click detector 20 detects patterns in the sequence of coefficients which would cause clicks, or similar discontinuities, in the output of the source decoder 50. These patterns may be associated with bit-errors in the received signal. When such an artefact is detected by the click detector 20, it controls a coefficient combination unit 40 to suppress or mask the artefact.

Figure 2:
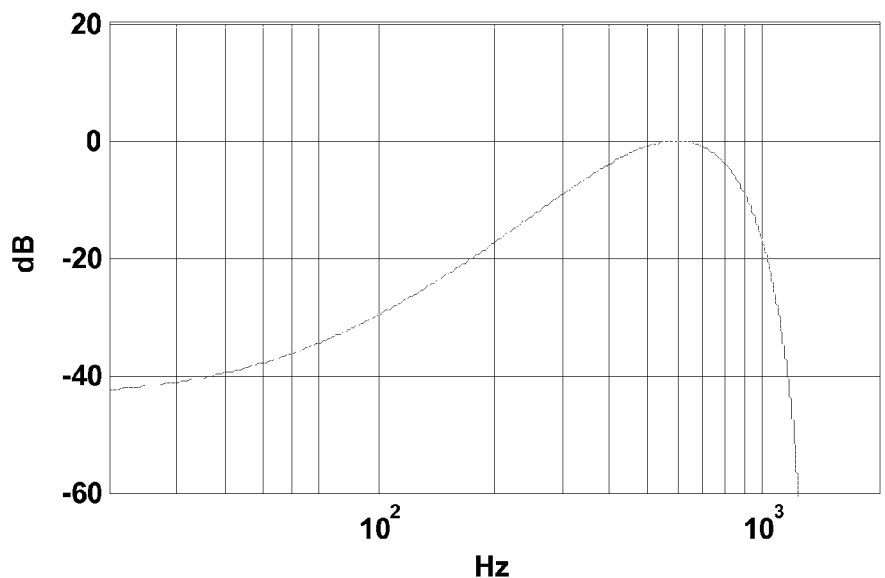
FIG. 2 shows an exemplary frequency response of a suitable band-pass filter for the embodiment of FIG. 1.

The band-pass filter 30 filters the sub-band coefficients. Band-pass filtering attenuates low and high frequency components of the sequence of coefficients, which reduces the sharpness and low frequency rumble of discontinuities which may be associated with errors. The resulting, smoothed sequence of coefficients is input to the coefficient combination unit 40. An exemplary frequency response suitable for the band-pass filter is shown in FIG. 2.

The coefficient combination unit 40 is arranged to receive control inputs from the click detector 20; sub-band coefficients for the first sub-band sb0 from the channel decoder 10 and filtered sub-band coefficients from the band-pass filter 30. The combination unit comprises two variable gain elements 42 and 44; and an adder 46. The first variable gain element 42 is arranged to receive the original sub-band coefficients for the first sub-band sb0. The second variable gain element is arranged to receive modified (filtered) sub-band coefficients from the band-pass filter 30. The gain of each variable gain element 42, 44 is controlled by a control input from the click detector. Each element scales the input coefficient values by a variable factor, which is determined under the control of the click detector. The outputs of the two gain elements 42, 44 are coupled to the adder 46, which sums them. The combination unit 40 therefore implements a weighted summation of the original coefficients and the modified (band-pass filtered) coefficients, wherein the weights (scaling factors) depend on whether or not the click detector has detected an error. Thus, in this embodiment, the combination unit 40 is a cross-fader.

The output of the adder 46 in the cross-fader 40 is coupled to the input of the source decoder for the first sub-band sb0. In this way, the error concealment apparatus of the embodiment comprises an additional processing stage between the channel decoder 10 and source decoder 50. The source decoder 50 uses the processed coefficients for the first sub-band sb0 when reconstructing the audio signal.

According to the present embodiment, when the click detector detects a click (that is, an error in the received coefficients), the weights are determined by convolving the pulse train generated by the error detection unit by a window function, and saturating the result to 1. The obtained signal is the weight to be applied to the modified coefficients, called $w_m$. The weight for the received coefficients is defined as $w_r = 1 - w_m$. When no error is detected, the weights have the values 1 for the originally received coefficients and 0 for the filtered weights.

Figure 3:
FIG. 3 shows example weights generated from the output of the click detector: the upper plots shows the click-detection output, the lower plot is the resulting weight after convolution and saturation to 1.

This process of weight determination is illustrated in FIG. 3. As shown in the upper part of FIG. 3, the click detector generates an impulse (delta function) each time an error is detected. Convolution with a window function ensures that the weights exhibit a smooth transition before and after a click (or series of clicks). The result of the convolution is clipped at the maximum weight value of 1, as shown in the lower part of FIG. 3. This means that a series of clicks in quick succession will cause the weight values to remain constant at $w_m = 1$, $w_r = 0$.

Figure 4:
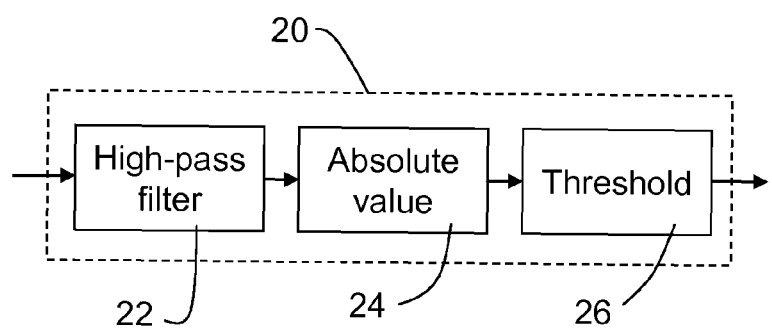
FIG. 4 is a block diagram of a click detector suitable for the receiver of the embodiment of FIG. 1.

An embodiment of the click detector is illustrated in FIG. 4. This comprises a high-pass filter 22, arranged to receive sub-band coefficients from the channel decoder 10 and filter them; an absolute value calculator 24, arranged to receive the filtered series of coefficients from the high-pass filter 22 and calculate absolute values; and a threshold comparator 26 arranged to receive a series of absolute values from the absolute value calculator 24 and compare them to a threshold. If the absolute values are greater than the threshold, the click detector 20 indicates that an error has been detected.

Figure 5:
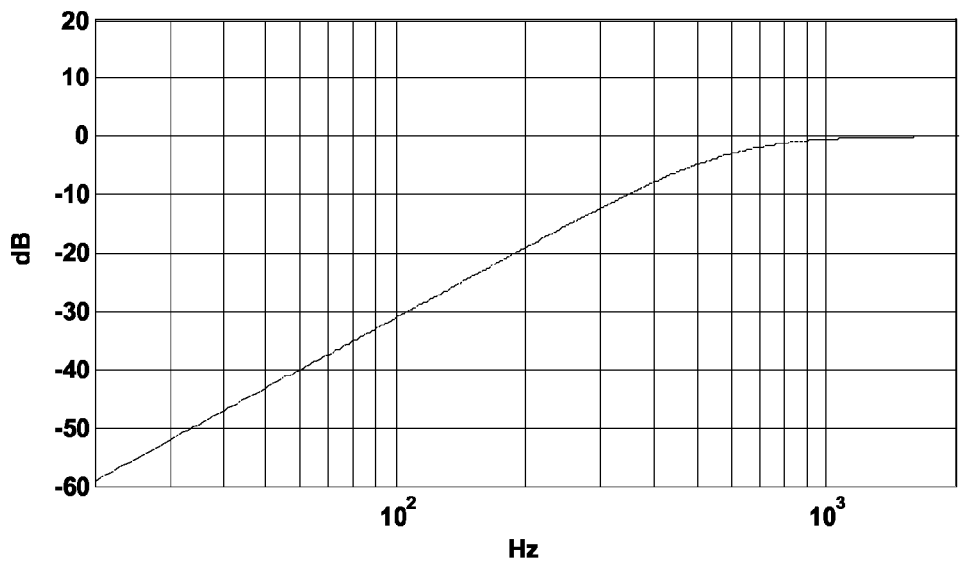
FIG. 5 shows the frequency response of a filter suitable for use in the click detector.

In this embodiment the filter is designed as a second order Butterworth IIR filter with a cut-off frequency at 600 Hz. The threshold applied to the absolute values is −24 dBFS. The frequency response of this filter is shown in FIG. 5.

The delay introduced by the click detector 20, including the group delay of the high-pass filter 22, should match the group delay of the band-pass filter 30. This will mean that the control signals applied to the variable gain elements 42 and 44 will be synchronised with the arrival of the filtered coefficients from the band-pass filter 30 at the gain element 44. As will be readily apparent to those skilled in the art, equivalent delay elements should also be introduced in the other signal paths, to maintain synchronization.

Figure 6:
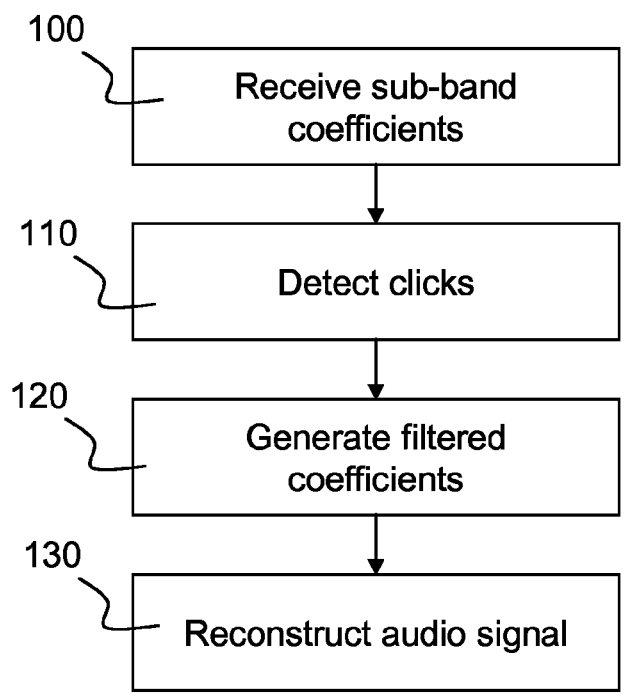
FIG. 6 is a flowchart of a method of error concealment according to an embodiment.

FIG. 6 illustrates a method according to an embodiment of the invention. The method may be implemented by apparatus like that of FIG. 1. The method comprises receiving 100 sub-band coefficients for several sub-bands in a sub-band coding scheme. Clicks are detected 110 in the series of coefficients for at least the lowest frequency sub-band. Filtering 120 is performed, to generate a series of filtered coefficients. Click errors are suppressed in this modified series. In step 130, an audio signal is reconstructed, using a combination of the received coefficients and the modified coefficients.

In the reconstruction 130, the modified coefficients and the original, received coefficients are combined in a weighted summation. The weights used are determined according to the clicks detected 110 in the series of coefficients. When a click is detected, the weights give preference to the modified series, in which the click has been attenuated. When no click is detected, the weights give preference to the original, unmodified series of coefficients. This ensures that clicks (and similar discontinuities) can be reduced in the output signal, while distorting correctly received coefficients as little as possible.

While the invention has been illustrated and described in detail in the drawings and foregoing description, such illustration and description are to be considered illustrative or exemplary and not restrictive; the invention is not limited to the disclosed embodiments.

For example, it is possible to operate the invention in an embodiment wherein the error concealment processing is applied additionally or alternatively to other sub-bands (other than the lowest frequency sub-band).

As those skilled in the art will recognise, the invention may be implemented in bespoke hardware, according to a block diagram like that shown in FIG. 1. Alternatively, it may be implemented using a general purpose processor, programmed appropriately—for example, programmed so as to implement a method like that shown in FIG. 3.

Likewise, those skilled in the art will appreciate that other techniques may be employed to detect errors such as clicks, or to suppress or mask the effect of the errors, as alternatives to the exemplary techniques described above.

For example, a more complicated click detection technique has been disclosed at http://gwc.sourceforge.net/gwc science/node6.html. This technique also exploits high-pass filtering to detect sharp discontinuities, such as clicks or pops. However, it uses a more complex test than the embodiment described above. The first derivative of the high-pass filter output is examined to decide if there is a click. Two threshold tests are applied, based on the mean and standard deviation of the derivative and the mean of the filter output, respectively.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A decoder for a sub-band coded digital audio signal, the decoder comprising:
    an input, which receives audio sub-band coefficients for a plurality of sub-bands of the audio signal;
    an error detection unit, configured to analyze the content of a sequence of the received audio coefficients in one of the sub-bands, to derive for each coefficient an indication of whether the coefficient has been corrupted by an error of a predefined type;
    an error masking unit, configured to attenuate audio coefficient errors in the sequence and thereby generate a modified sequence of audio coefficients for the sub-band;
    a coefficient combination unit, configured to combine the received audio coefficients and the modified audio coefficients, in dependence upon the indication of error; and
    a signal reconstruction unit, configured to reconstruct the audio signal using the combined coefficients,
    wherein the coefficient combination unit comprises a cross-fader, configured to mix the received audio coefficients and the modified audio coefficients in a weighted combination, wherein the weighting depends on the indication of error.

2. The decoder of claim 1, wherein the error detection unit comprises a high-pass filter, arranged to high-pass filter the sequence of coefficients,
    the output of the high-pass filter being coupled to the input of an absolute value calculation unit, which calculates absolute values of the filtered coefficients,
    the output of the absolute value calculation unit being coupled to the input of a decision unit, which decides whether an error is indicated by comparing the absolute values with a threshold.

3. The decoder of claim 1, wherein the error masking unit comprises a low-pass or band-pass filter, which smooths discontinuities in the sequence of coefficients.

4. The decoder of claim 1, further comprising a channel decoder, configured to receive a channel-coded bitstream; perform channel decoding; and output the sub-band coefficients.

5. The decoder of claim 4, wherein the decoder is operable to receive a DAB audio stream encoded according to MPEG Layer 2 audio.

6. A method of concealing a bit-error in a sub-band coded digital audio signal, the method comprising:
    receiving audio sub-band coefficients for a plurality of sub-bands of the audio signal;
    analyzing the content of a sequence of the received audio coefficients in one of the sub-bands, to derive for each coefficient an indication of whether the coefficient has been corrupted by an error of a predefined type;
    attenuating audio coefficient errors in the sequence and thereby generating a modified sequence of audio coefficients for the sub-band; and
    reconstructing the audio signal using the received audio coefficients and the modified audio coefficients, in dependence upon the indication of error,
    wherein the step of reconstructing the audio signal comprises calculating a weighted sum of the received audio coefficients and the modified audio coefficients, wherein the weights are determined based upon the indication of error.

7. The method of claim 6, wherein the analysis of the content comprises detecting a sequence of coefficients that would cause a click in the reconstructed audio signal.

8. The method of claim 7, wherein the detection of the click comprises high-pass filtering the sequence of coefficients.

9. The method of claim 8, wherein the indication of whether a coefficient has been corrupted by an error is derived by comparing the magnitude of the high-pass filtered sequence of coefficients with a threshold.

10. The method of claim 6, wherein the step of generating a modified sequence of coefficients for the sub-band comprises low-pass or band-pass filtering the sequence.

11. The method of claim 6, wherein the step of reconstructing the audio signal further comprises synthesizing an audio signal by combining the weighted, summed coefficients with the received sub-band coefficients for the remaining sub-bands.

12. An article of manufacture comprising a non-transitory, tangible computer readable storage medium containing executable computer instructions which performs all the steps of claim 6.

* * * * *